(12) United States Patent
Meyer et al.

(10) Patent No.: US 8,786,105 B1
(45) Date of Patent: Jul. 22, 2014

(54) SEMICONDUCTOR DEVICE WITH CHIP HAVING LOW-K-LAYERS

(71) Applicants: Thorsten Meyer, Regensburg (DE); Sven Albers, Regensburg (DE); Christian Geissler, Teugn (DE); Andreas Wolter, Regensburg (DE); Markus Brunnbauer, Lappersdorf (DE); David O'Sullivan, Sinzing (DE); Frank Zudock, Regensburg (DE); Jan Proschwitz, Riesa (DE)

(72) Inventors: Thorsten Meyer, Regensburg (DE); Sven Albers, Regensburg (DE); Christian Geissler, Teugn (DE); Andreas Wolter, Regensburg (DE); Markus Brunnbauer, Lappersdorf (DE); David O'Sullivan, Sinzing (DE); Frank Zudock, Regensburg (DE); Jan Proschwitz, Riesa (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/739,045

(22) Filed: Jan. 11, 2013

(51) Int. Cl.
  *H01L 23/48* (2006.01)
  *H01L 21/00* (2006.01)

(52) U.S. Cl.
  USPC .......... 257/778; 257/737; 257/E23.069; 257/E21.503; 438/108; 438/112; 438/613; 438/614

(58) Field of Classification Search
  USPC .......... 257/621, 737, 738, 778, E23.021, 257/E23.069, E21.503; 438/108, 612–617, 438/112
  See application file for complete search history.

(56) References Cited

U.S. PATENT DOCUMENTS

| | | | |
|---|---|---|---|
| 2007/0249102 A1 | 10/2007 | Brunnbauer et al. | |
| 2010/0237481 A1* | 9/2010 | Chi et al. | 257/685 |
| 2013/0270693 A1* | 10/2013 | Tseng et al. | 257/737 |

* cited by examiner

*Primary Examiner* — Jasmine Clark (57) ABSTRACT

A semiconductor device is described having at least one semiconductor chip, the chip having an active area on a top side thereof, the active area formed at least in part of low-k material, said low-k material defining a low-k subarea of said active area; an embedding material, in which said at least one semiconductor chip is embedded, at least part of the embedding material forming a coplanar area with said active area; at least one contact area within the low-k subarea; a redistribution layer on the coplanar area, the redistribution layer connected to said contact areas; at least one first-level interconnect, located outside said low-k subarea, the first-level interconnect electrically connected to at least one of said contact areas via the redistribution layer.

30 Claims, 6 Drawing Sheets

FIG.1A

FIG.1C

SEMICONDUCTOR DEVICE WITH CHIP HAVING LOW-K-LAYERS

TECHNICAL FIELD

The disclosure relates to a semiconductor device, and more particularly to semiconductor chips which may include low-k material.

BACKGROUND

Flip-Chip packaging technology is widely used for packaging in the mobile application space. Different first-level interconnect principles, the connection between the chip and the Flip Chip Substrate, were developed to address the needs of, for example, smaller pitch, of future technology nodes. The first level interconnects also serve as mechanical joints between the die and substrate and thus couple chip mechanically to the substrate. During reliability testing a large deformation, caused by the mismatch in thermal expansion is observed. This is known to lead to defects (cracks) in the brittle low-k-layers of the chip.

For 40 nm front end technology and following generations a polymer dielectric layer on the die was introduced. This layer acts as a stress buffer and protects the ultra-low-k-layers from mechanical damage. During the package process and especially after the assembly on a printed circuit board (PCB), in addition to the residual stresses and the ultra-low-k stack thermal mismatch stresses of the wafer processes, the global thermal mismatch of the package internally and between package and board causes stress on the copper/low-k- and ultra-low-k-structures.

For future technology nodes beyond today's available technologies the introduction of (porous) low-k-layers will be needed to allow higher speed and higher density. These (porous) low-k-layers with k<2.5 can be reached by introducing air gaps (air k=1). The air gaps will lead to a very brittle layer, which will be very sensitive to mechanical forces. Probably the application of a dielectric on the active chip surface will not be sufficient to prevent the (porous) low-k-layer from cracking due to the stress which is transferred from especially the first-level interconnects (solder bumps or copper columns)

BRIEF SUMMARY

The present disclosure provides a solution for reliably packaging of chip with stress-sensitive material such as (porous) low-k-layers in Flip Chip Technology.

According to an aspect of the present disclosure, a semiconductor device is disclosed having: at least one semiconductor chip, the chip having an active area on a top side thereof, the active area formed at least in part of low-k material, said low-k material defining a low-k subarea of said active area; at least one contact area within the low-k subarea; at least one first-level interconnect, located outside said low-k subarea, the first-level interconnect electrically connected to at least one of said contact areas.

According to a further aspect of the present disclosure, the device may include an embedding material, in which said at least one semiconductor chip is embedded, at least part of the embedding material forming a coplanar area with said active area.

According to a further aspect of the present disclosure, the device may include a redistribution layer on the coplanar area, the redistribution layer connected to said contact areas. At least one of said first-level interconnects is electrically connected to at least one of said contact areas via the redistribution layer.

According to a further aspect of the present disclosure, the device may include a dielectric layer disposed on the coplanar area.

According to a further aspect of the present disclosure, the device may include a protection layer applied over said low-k subarea. The protection layer is composed of one or more materials selected from the group including: silicone, polyurethane, epoxy, polyimide, silicone particles with air gaps, air foams, bubbles.

According to a further aspect of the present disclosure, the device may include a lid applied over said active area. The lid is one of a polymer lid, a metal lid and a ceramic lid. The lid is glued, soldered, clamped, or bonded to said active area.

According to a further aspect of the present disclosure, the first-level interconnects are located at a back side of said chip. At least one of said first-level interconnects is electrically connected to at least one of said contact areas by through-silicon-vias. Said low-k subarea is mechanically decoupled from said back side of the chip by at least one layer of silicon.

According to a further aspect of the present disclosure, the device may include a substrate connected to the first-level interconnects. The first-level interconnects are flip-chip bumps or copper pillars.

According to an aspect of the present disclosure, a semiconductor device is disclosed having: at least one semiconductor chip, the chip having an active area on a top side thereof, the active area formed at least in part of low-k material, said low-k material defining a low-k subarea of said active area; an embedding material, in which said at least one semiconductor chip is embedded, at least part of the embedding material forming a coplanar area with said active area; at least one contact area within the low-k subarea; a redistribution layer on the coplanar area, the redistribution layer connected to said contact areas; at least one first-level interconnect, located outside said low-k subarea, the first-level interconnect electrically connected to at least one of said contact areas via the redistribution layer.

According to a further aspect of the present disclosure, the device may include a dielectric layer disposed on the coplanar area.

According to a further aspect of the present disclosure, the device may include a protection layer applied over said low-k subarea. The protection layer is composed of one or more materials selected from the group including: silicone, polyurethane, epoxy, polyimide, silicone particles with air gaps, air foams, bubbles.

According to a further aspect of the present disclosure, the device may include a lid applied over said active area. The lid is one of a polymer lid, a metal lid and a ceramic lid. The lid is glued, soldered, clamped, or bonded to said active area.

According to a further aspect of the present disclosure, the device may include a substrate connected to the first-level interconnects. The first-level interconnects are flip-chip bumps or copper pillars.

According to an aspect of the present disclosure, a method of producing a semiconductor device is disclosed including embedding a semiconductor chip, including a top side with an active area formed at least part of low-k material, said low-k material defining a low-k subarea, into an embedding material; forming a planar surface on said embedding material, the active area coplanar therewith; disposing at least one contact area within the low-k sub-area; applying a redistribution layer on the coplanar area, the redistribution layer electrically connected to said contact area; forming at least one first-level interconnect outside said low-k subarea, the first-level interconnect electrically connected to at least one contact area within said low-k subarea via the redistribution layer.

According to a further aspect of the present disclosure, the method may include depositing a dielectric layer on the coplanar area.

According to a further aspect of the present disclosure, the method may include applying a protection layer over said low-k subarea.

According to a further aspect of the present disclosure, the method may include attaching a lid over said low-k subarea.

According to a further aspect of the present disclosure, the method may include connecting a substrate with the first-level interconnects.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. In the following description, various approaches are described with reference to the following drawings, in which.

DETAILED DESCRIPTION

In the following detailed description, reference is made to the accompanying drawings, which form a part hereof, and in which is shown by way of illustration specific approaches in which the disclosure may be practiced. In this regard, directional terminology, such as "top," "bottom," etc., is used with reference to the orientation of the Figure(s) being described. Because components of approaches of the present disclosure can be positioned in a number of different orientations, the directional terminology is used for purposes of illustration and is in no way limiting. It is to be understood that other approach may be utilized and structural or logical changes may be made without departing from the scope of the present disclosure. The following detailed description, therefore, is not to be taken in a limiting sense, and the scope of the present disclosure is defined by the appended claims.

The present disclosure proposes to decouple the active side of the chip and the interposer board. This may be accomplished in one aspect by using a fan-out principle to avoid bumps over an active area of the chip. Additionally, the brittle active area can completely or partly be protected by a protection material or a lid.

The standard Flip Chip Flow (bumping of silicon wafer, separation, assembly to interposer, overmolding/underfilling, ball application) is changed. In one approach, the wafer is separated after front-end-processing and the chips are embedded in a mold compound by using the eWLB reconstitution processes. After molding the wafer, typically, but not necessarily a dielectric layer is applied. After that, a redistribution layer (e.g. thin-film technology) is applied onto the reconstituted wafer. This way, the positions of the bumps, which have been distributed over the chip surface are redistributed onto the fan-out area, outside the active area of the silicon with its mechanically unstable low-k layers. At the end point of the redistribution, a bump or copper pillar (first level Flip Chip Interconnect) is formed. Now the reconstituted wafer is separated into individual packages. Those are attached to the interposer board, soldered and underfilled/over-/under-molded.

Due to the first level interconnects on the fan-out area, the mechanical stress caused by the solder bumps is decoupled from the (porous) low-k-layers of the silicon chip, isolating it from mechanical damage. For further improvement: decoupling of the brittle low-k material, an additional layer (e.g. very soft, porous) can be applied as a buffer layer on the low-k-layers. Also the application of a lid to protect the active die area is possible. The lid can be made of plastic or metal, it can be attached as complete lid or it can be generated on the die/wafer in printing, thin-film or any other technology. The lid may define a cavity filled, for example with air or other material, or a vacuum. The lid material may also be crack resistant itself and have, for example, a respective low Young's modulus or low CTE (coefficient of thermal expansion), or alternately have a CTE close to that of the chip to avoid inducing thermo-mechanical stress. Examples are Silicon or highly filled polymers, but also unfilled or minimally filled polymers.

Another approach can be the use of TSVs in the package. This way, the connections can be directed from the active side of the die (with (porous) low-k-layers) to its backside. There solder bumps or copper pillars are applied and the die is mounted up-side-down on the interposer board. After underfilling/over-/under-molding the (porous) low-k-layers are protected and face opposite the interposer board and the first level interconnect elements, decoupled from the active area by the intervening silicon. According to an aspect of the disclosure, the decoupling may be said to take place by redistributing contact areas for first-level interconnects to more structurally stable areas. As defined herein, structurally stable indicates at least less brittle than the low-k-layers on the active area. Structurally stable may include all layers which do not contain brittle or porous low-k layers and/or having mechanical stiffness sufficient to withstand stresses due to the application and use of first-level interconnects. [

In the further text, a semiconductor device 100 according to one approach of the present disclosure is described with reference to FIG. 1A.

Semiconductor device 100 contains a chip 102 in which low-k-layers are formed. In this sense chip 102 may itself be considered formed of low-k material. Chip 102 is shown embedded in a mold compound 104 such as a mold compound as used in the eWLB technology or laminate. The mold compound used for eWLB may be a liquid mold compound. One exemplary matrix of the mold compound is epoxy with additions and highly filled with filler particles. Chip 102 is embedded in mold compound 104 in such a way that edge sides 124 and the rear side 122 of chip 102 are embedded into mold compound 104, and the top side 120 of chip 102 forms a coplanar area, indicated by plane I-I in FIG. 1A, with parts of mold compound 104. Contact areas 126 of chip 102 are at top side 120, which defines an active area. The area beneath the active area of chip 102 defines a chip shadow area 140, and the area beneath mold compound 104 but outside chip shadow area 140 defines a fan-out area 142. As illustrated in FIG. 1A, a patterned dielectric layer 106 is applied to coplanar area I-I, which patterned dielectric layer 106 covers coplanar area I-I but leaves contact areas 126 free. In a typical embodiment, openings in the dielectric layer 106 define the contact areas of chip 102, protecting other structures thereon from exposure. In particular, a redistribution layer 108 is formed on dielectric layer 106. Redistribution layer 108 is a patterned electrically conductive layer providing discrete conductive redistribute elements 108a. Each element 108a is shown having two parts: a first part 132 located in chip shadow area 140 named as shadow-area-end 132; and a second part 134 located outside chip shadow area 140, for example in fan-out area 142, named as fan-out-area-end 134. Shadow-area-ends 132 of redistribution layer 108 provides connection to contact areas 126 of chip 102, and fan-out-area-ends 134 of redistribution layer 108 are provided with Flip Chip (FC) bumps 110. FC bumps are typically deposited on the chip pads on the top side of the wafer during the final wafer processing step. In order to mount the chip to a flip chip substrate, it is flipped over so that its top side faces down, and aligned so that its pads align with matching pads on the external circuit, and then the solder is flowed to complete the interconnect.

In contrast to the much larger BGA balls, which are typically placed in pitches of 0.5 mm or 0.4 mm, flip chip (FC) bumps are not thermo-mechanically reliable without underfill for chip sizes as typically used in the mobile industry.

A typical FC bump is electroplated or printed, while BGA solder balls are typically dropped as preformed solder balls. Exemplary sizes for FC bumps are 60-90 μm (pitch 120-200 μm) while BGA solder balls have a nominal diameter of 250 μm (for pitch 0.4 mm) to 300 μm (for pitch 0.5 mm).

Figure 1A:
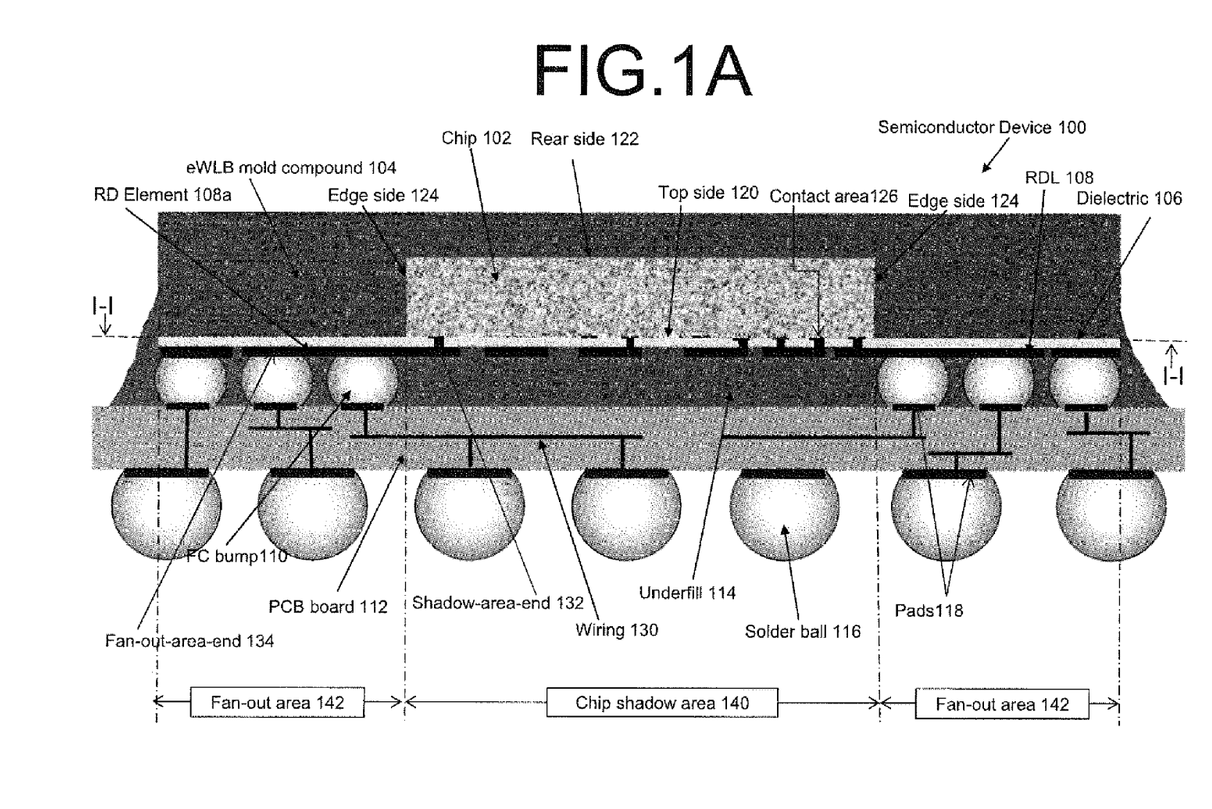
FIG. 1A shows a cross-section of an exemplary semiconductor device.
Figure 1B:
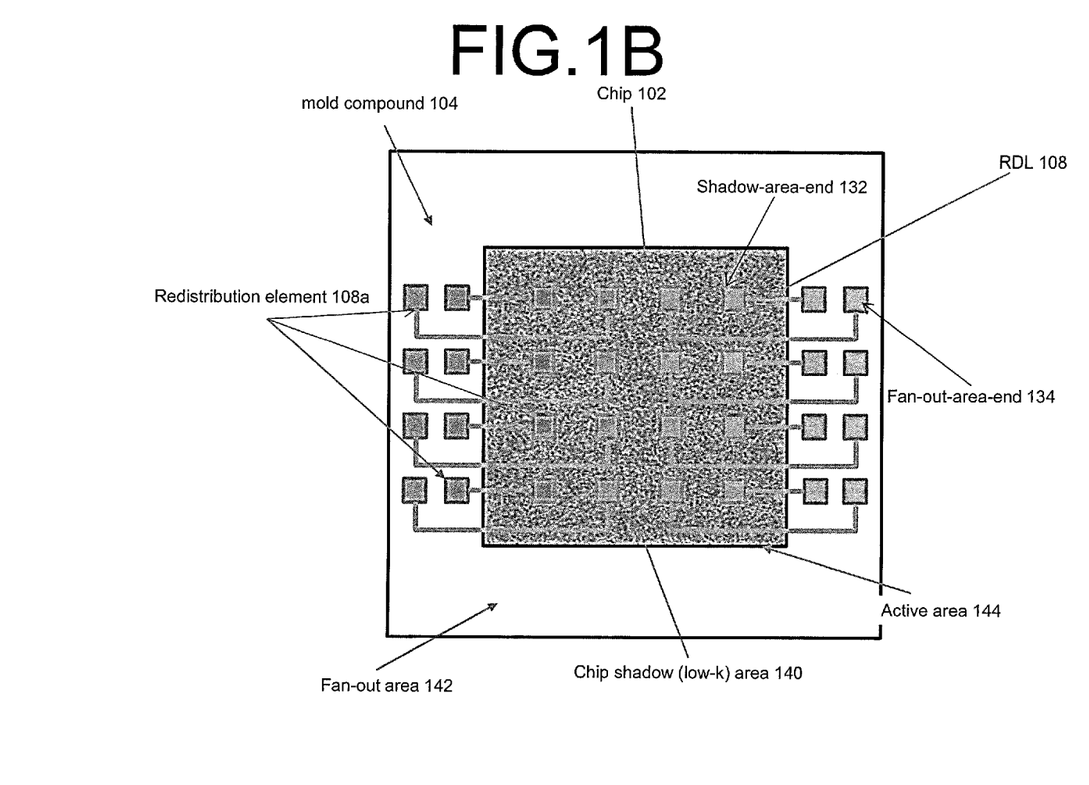
FIG. 1B shows a plan view of the exemplary semiconductor device in accordance with FIG. 1A.

The arrangement of redistribution layer 108 can be discerned particularly clearly in the plan view in FIG. 1B. FIG. 1B illustrates a plan view of chip 102 embedded into eWLB mold compound 104. The area where chip 102 is fixed below is shadow area 140, and the area where eWLB mold compound 104 is formed thereto is fan-out area 142. Shadow-area-ends 132 of redistribution layer 108 are located in chip shadow area 140, connecting to chip 102 via contact areas 126, while fan-out-area-ends 134 of redistribution layer 108 are arranged on fan-out area 142. The chip shadow area 140 is coextensive with the active area 144 of the chip 102. As disclosed herein, the chip shadow area may form all or a part of the active area of the chip. More specifically, the chip shadow area is understood as the low-k or structurally relevant area (i.e. the area with limited structural stability), which may be a subset of the active area 144 of the chip. The shadow area may thus be considered a low-k subarea of the chip, or a low-k subarea of the active area of chip 102. Likewise, the structurally relevant area may extend beyond the border of the active area of the chip. As shown here, the active area is coextensive with the shadow area.

Figure 1C:
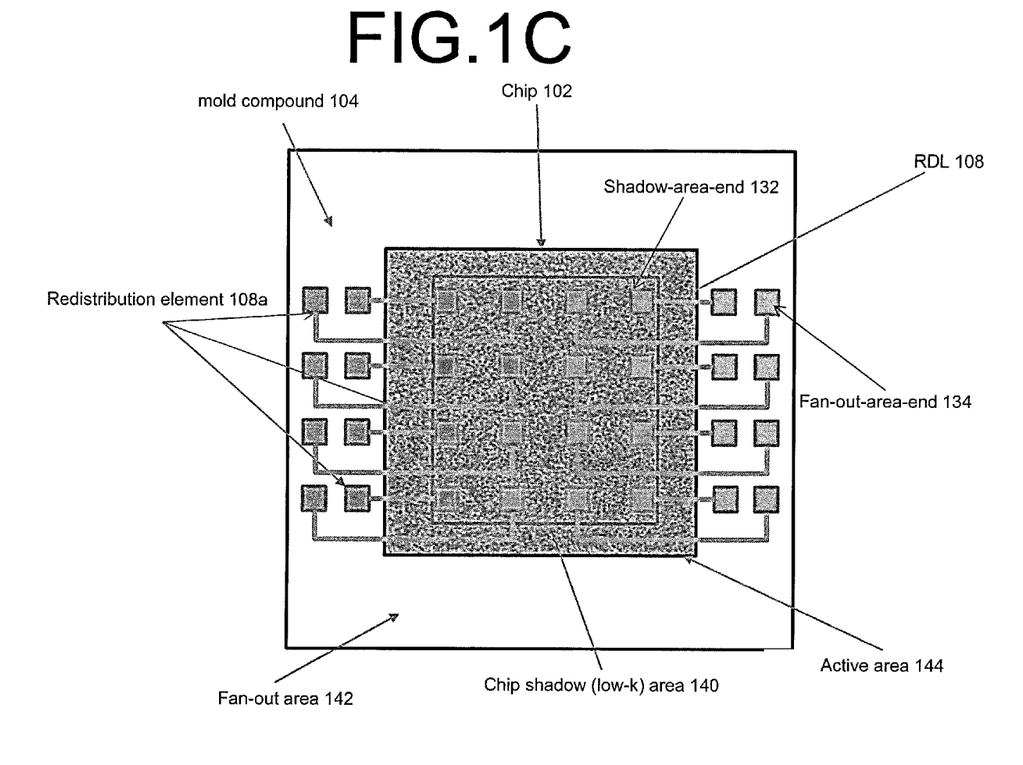
FIG. 1C shows another plan view of the exemplary semiconductor device in accordance with FIG. 1A.

As illustrated in FIG. 1C, the chip shadow area (or the low-k subarea) 140 may be smaller than the active area 144 of the chip 102.

As illustrated in FIG. 1A, one side of FC bumps 110 are soldered on fan-out-area-ends 134 of redistribution layer 108, and the opposite side of FC bumps 110 are attached to the top side of a PCB board 112 by pads 118. Between coplanar area I-I and PCB board 112, underfill 114 is applied. On the bottom side of PCB board 112, solder balls 116 are soldered evenly to pads 118. Wiring 130 going through PCB board 112 connects solder bumps 110 with solder balls 116.

FIG. 1A illustrates an arrangement in which contact areas 126, which have been distributed over the chip active area are redistributed on fan-out area 142, outside the active area of chip 102. When needed, dielectric layer 106 can be formed of dielectrics having relative permittivity of less than 4, i.e. a low-k dielectric. A low-k dielectric may be porous or due to other reason of low mechanical stability and therefore not capable of withstanding high mechanical loading. Consequently, positions of FC bumps 110, namely contact areas 126, which have been defined over the chip surface by dielectric layer 106 are redistributed on fan-out area 142 by redistribution layer 108. Due to FC bumps 110 fitting on fan-out area 142, mechanical stress caused by or transmitted through FC bumps 110 is isolated or decoupled from the low-k-layers of chip 102, preventing damage thereto.

Semiconductor device 100 in accordance with FIG. 1A has only one semiconductor chip 102. It is possible, however, also to integrate a plurality of semiconductor chips in a semiconductor device 100 according to the present disclosure. One or more of the additional semiconductor chips may include respective active areas, one or more of which may include low-k layers or layers of limited structural stability. The additional semiconductor chips may selectively also employ the aspects of the present disclosure in decoupling the active areas from transmitted stresses.

Figure 2:
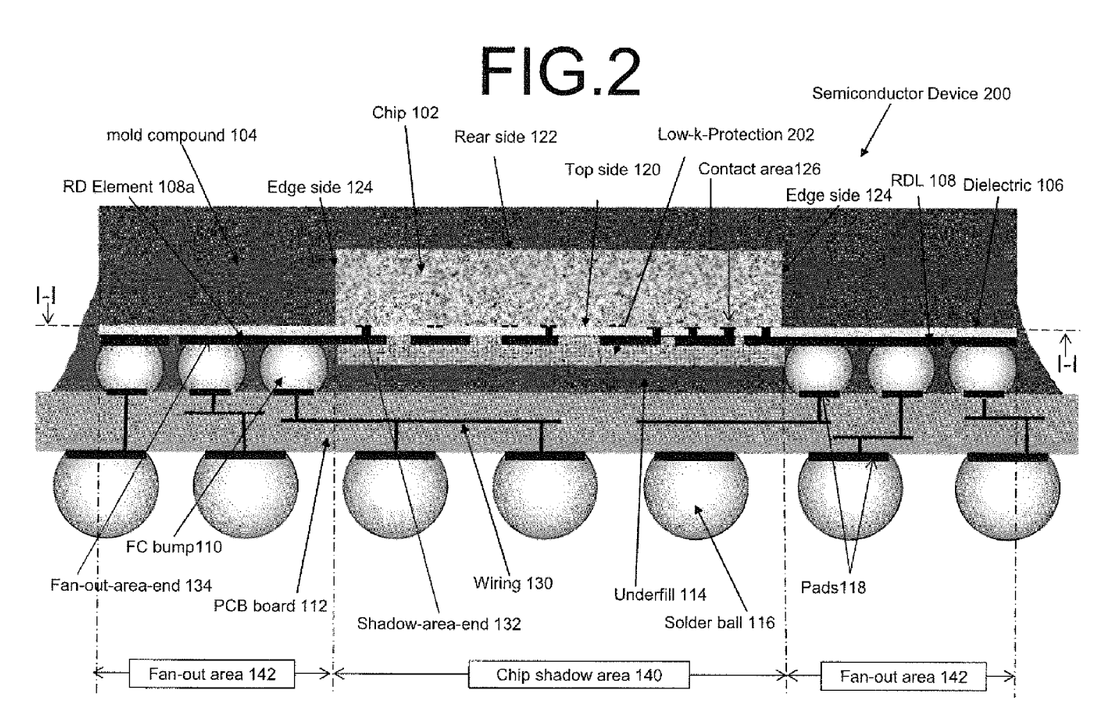
FIG. 2 shows a cross-section of an exemplary semiconductor device having a low-k-Protection layer.

For further improvement of the semiconductor device, an additional layer as Low-k-Protection layer 202 can be applied as illustrated in FIG. 2.

FIG. 2 shows a semiconductor device 200 in accordance with an approach of the present disclosure. Semiconductor device 200 similar to semiconductor device 100 of FIG. 1A contains a chip 102 in which low-k-layers are formed. In this sense chip 102 may itself be considered formed of low-k material. Chip 102 is shown embedded in mold compound 104 in such a way that edge sides 124 and the rear side 122 of chip 102 are embedded into mold compound 104, and the top side 120 of chip 102 forms a coplanar area, indicated by plane I-I in FIG. 2, with parts of mold compound 104. Contact areas 126 of chip 102 are at top side 120, which defines an active area. The area beneath the active area of chip 102 defines a chip shadow area 140, and the area beneath mold compound 104 but outside chip shadow area 140 defines a fan-out area 142. As illustrated in FIG. 2, a patterned dielectric layer 106 is applied to coplanar area I-I, which patterned dielectric layer 106 covers coplanar area I-I but leaves contact areas 126 free. In a typical embodiment, openings in the dielectric layer 106 define the contact areas of chip 102, protecting other structures thereon from exposure. In particular, a redistribution layer 108 is formed on dielectric layer 106. Redistribution layer 108 is a patterned electrically conductive layer providing discrete conductive redistribute elements 108a. Each element 108a is shown having two parts: a first part 132 located in chip shadow area 140 named as shadow-area-end 132; and a second part 134 located outside chip shadow area 140, for example in fan-out area 142, named as fan-out-area-end 134. As disclosed herein, the chip shadow area may form all or a part of the active area of the chip. More specifically, the chip shadow area is understood as the low-k or structurally relevant area (i.e. the area with limited structural stability), which may be a subset of the active area of the chip. The shadow area may thus be considered a low-k subarea of the chip, or a low-k subarea of the active area of chip 102. Likewise, the structurally relevant area may extend beyond the border of the active area of the chip. As shown here, the active area is coextensive with the shadow area. Shadow-area-ends 132 of redistribution layer 108 provide connections to contact areas 126 of chip 102, and fan-out-area-ends 134 of redistribution layer 108 are provided with FC bumps 110. Thus, stress transmitting FC bumps 110 are provided on contacts that have been re-routed out of the shadow area.

As illustrated in FIG. 2, one side of FC bumps 110 are soldered on fan-out-area-ends 134 of redistribution layer 108, and the opposite side of FC bumps 110 are attached to the top side of a PCB board 112 by pads 118. Between coplanar area I-I and PCB board 112, underfill 114 is molded. On the bottom side of PCB board 112, solder balls 116 are soldered evenly to pads 118. Wiring 130 going through PCB board 112 connects solder bumps 110 with solder balls 116. Semiconductor device 200 may further contain a low-k-Protection layer 202 applied over the active area of the chip 102, typically covering the dielectric layer 106 and the redistribution layer 108 at the chip shadow area 140. The material of the low-k-Protection layer 202 may be soft, e.g. silicone, polyurethane, or epoxy, etc. Alternatively, the low-k-Protection layer 202 may be filled with e.g. silicone particles, air gaps, or air or gas bubbles, etc.

Low-k-Protection layer 202 as applied over the active area of the chip 102, acts as a stress buffer layer that alleviates the stress level caused by external forces and protects the low-k-layers 202 of the chip 102 from mechanical damage.

Semiconductor device 200 in accordance with FIG. 2 has only one semiconductor chip 102. It is possible, however, also to integrate a plurality of semiconductor chips in a semiconductor device 200 according to the present disclosure.

Figure 3:
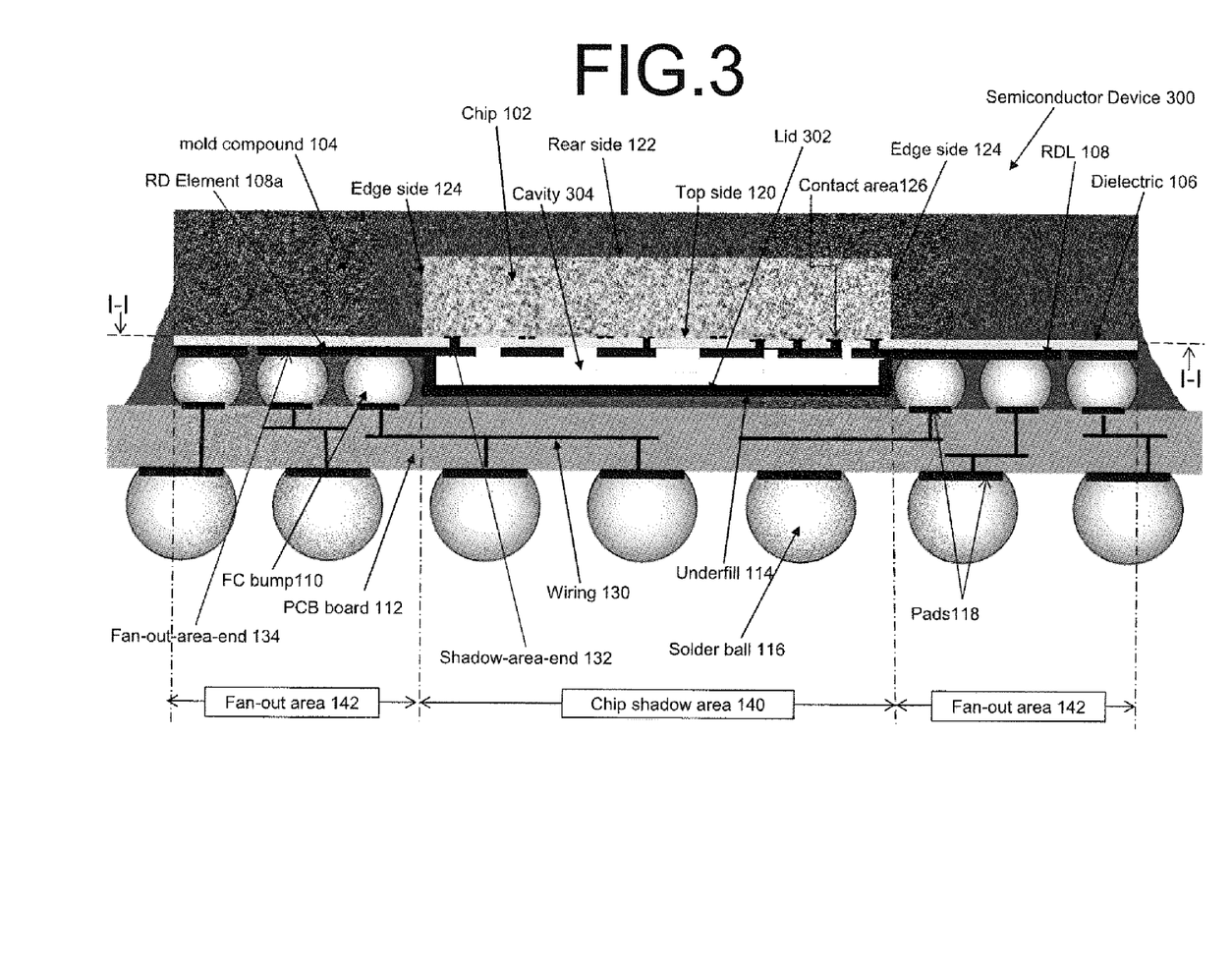
FIG. 3 shows a cross-section of an exemplary semiconductor device having a lid.

For further decoupling of the low-k-layer, a lid 302 can be applied as illustrated in FIG. 3.

FIG. 3 show a semiconductor device 300 in accordance with an approach of the present disclosure. Semiconductor device 300 similar to semiconductor device 100 of FIG. 1A contains a chip 102 in which low-k-layers are formed. In this sense chip 102 may itself be considered formed of low-k material. Chip 102 is shown embedded in an eWLB mold compound 104 in such a way that edge sides 124 and the rear side 122 of chip 102 are embedded into eWLB mold compound 104, and the top side 120 of chip 102 forms a coplanar area, indicated by plane I-I in FIG. 3, with parts of mold compound 104. Contact areas 126 of chip 102 are at top side 120, which defines an active area. The area beneath the active area of chip 102 defines a chip shadow area 140, and the area beneath eWLB mold compound 104 but outside chip shadow area 140 defines a fan-out area 142. As illustrated in FIG. 3, a patterned dielectric layer 106 is applied to coplanar area I-I, which patterned dielectric layer 106 covers coplanar area I-I but leaves contact areas 126 free. In a typical embodiment, openings in the dielectric layer 106 define the contact areas of chip 102, protecting other structures thereon from exposure. In particular, a redistribution layer 108 is formed on dielectric layer 106. Redistribution layer 108 is a patterned electrically conductive layer providing discrete conductive redistribute elements 108a. Each element 108a is shown having two parts: a first part 132 located in chip shadow area 140 named as shadow-area-end 132; and a second part 134 located outside chip shadow area 140, for example in fan-out area 142, named as fan-out-area-end 134. Shadow-area-ends 132 of redistribution layer 108 provides connection to contact areas 126 of chip 102, and fan-out-area-ends 134 of redistribution layer 108 are provided with FC bumps 110.

As illustrated in FIG. 3, one side of FC bumps 110 are soldered on fan-out-area-ends 134 of redistribution layer 108, and the opposite side of FC bumps 110 are attached to the top side of a PCB board 112 by pads 118. Between coplanar area I-I and PCB board 112, underfill 114 is molded. On the bottom side of PCB board 112, solder balls 116 are soldered evenly to pads 118. Wiring 130 going through PCB board 112 connects solder bumps 110 with solder balls 116. Semiconductor device 300 may further include a lid 302 covering the active area of chip 102. Between the active area of chip 102 and lid 302, a cavity 304 is formed filled with air or other gas. Lid 302 can be a polymer lid, a metal lid, a ceramic lid, etc. The lid can be glued, soldered, clamped, bonded or attached in any other way.

The application of a lid 302 isolates the active area of the chip 102 from underfill material 114 of semiconductor device 300. Lid 302 protects the active area of chip 102 from mechanical damage. The lid material may also be crack resistant itself and have a CTE close to that of chip 102 or be soft enough to avoid inducing thermo-mechanical stress.

Semiconductor device 300 in accordance with FIG. 3 has only one semiconductor chip 102. It is possible, however, also to integrate a plurality of semiconductor chips in a semiconductor device 300 according to the present disclosure.

Figure 4:
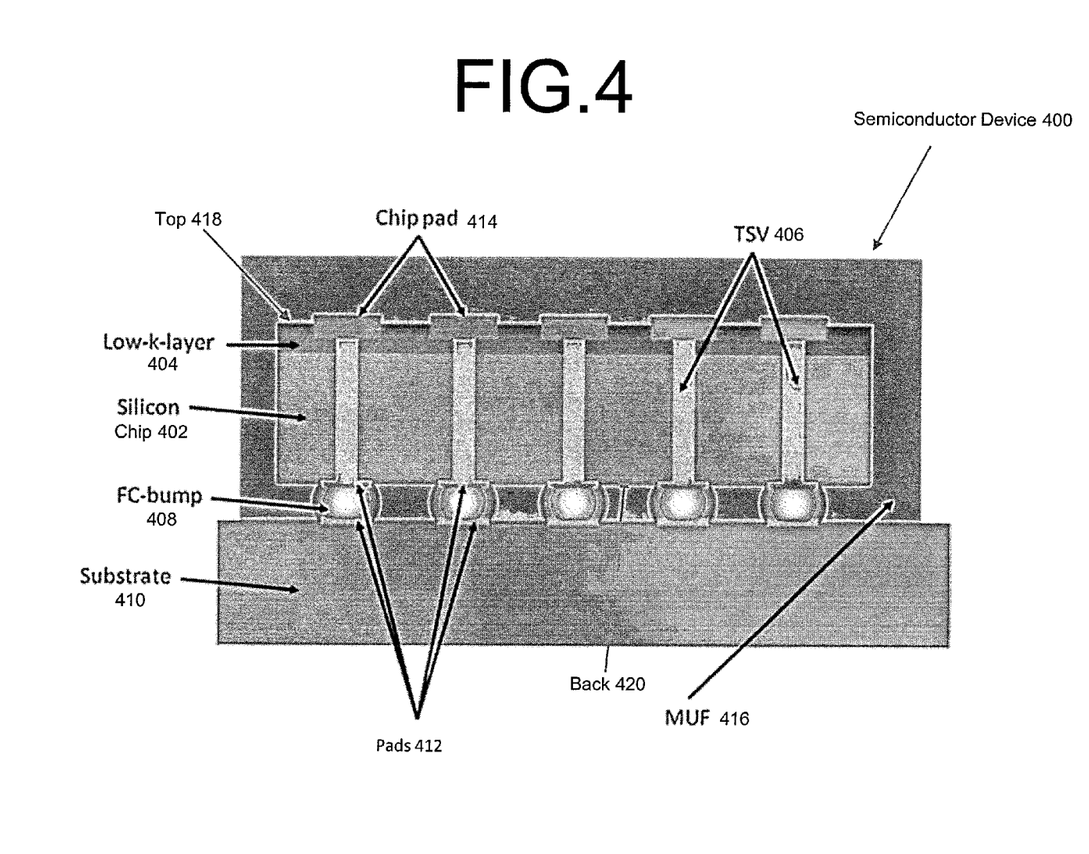
FIG. 4 shows a cross-section of an exemplary semiconductor device having Through Silicon Vias.

Another approach can be the use of TSVs in the package as illustrated in FIG. 4. A semiconductor device 400 according to one approach of the present disclosure is described with reference to FIG. 4.

Semiconductor device 400 contains a silicon chip 402 with low-k-layers on the top side 418. TSVs 406 connect chip pads 414 on top side 418 with pads 412 on the backside 420 of chip 402. One side of FC bumps 408 are soldered to back side 420 of silicon chip 402 with pads 412, and the opposite side of FC bumps 408 are attached to a substrate 410 with pads 412. Silicon chip 402 is embedded in mold underfill (MUF) 416.

In operation, chip 402 is mounted up-side down on substrate 410. Low-k-layers 404 at the active area of chip 402 are protected by MUF 416 and face opposite substrate 410 and FC bumps 408. Mechanical stress caused by or transmitted through FC bumps 408 and/or substrate 410 is isolated from the active area of chip 412, by the intervening silicon of chip 402.

Semiconductor device 400 in accordance with FIG. 4 has only one semiconductor chip 402. It is possible, however, also to integrate a plurality of semiconductor chips in a semiconductor device 400 according to the present disclosure.

While the disclosure has been particularly shown and described with reference to specific approaches, it should be understood by those skilled in the art that various changes in form and detail may be made therein without departing from the spirit and scope of the present disclosure as defined by the appended claims. The scope of the disclosure is thus indicated by the appended claims and all changes which come within the meaning and range of equivalency of the claims are therefore intended to be embraced.

What is claimed is:

1. A semiconductor device comprising:
   at least one semiconductor chip, the chip comprising: an active area on a top side of the at least one semiconductor chip, the active area being formed at least in part of a low-k material defining a low-k sub-area of the active area;
   an embedding material embedding the at least one semiconductor chip, wherein at least part of the embedding material forms a coplanar area with the active area;
   at least one contact area disposed within the low-k sub-area; and
   at least one interconnect, located outside the low-k sub-area, the interconnect electrically connected to the at least one contact area.

2. The device of claim 1, further comprising:
   a redistribution layer disposed on the coplanar area, wherein the redistribution layer is electrically connected to the at least one contact area.

3. The device of claim 2, wherein the at least one interconnect is electrically connected to the at least one contact area via the redistribution layer.

4. The device of claim 3, further comprising:
   a dielectric layer disposed on the coplanar area.

5. The device of claim 3, further comprising:
   a protection layer disposed over the low-k sub-area.

6. The device of claim 5, wherein the protection layer is composed of one or more materials selected from the group consisting of: silicone, polyurethane, epoxy, polyimide.

7. The device of claim 5, wherein the protection layer comprises silicone particles with one of the following fillers: air gaps, air foams, bubbles.

8. The device of claim 3, further comprising:
a lid disposed over the active area.

9. The device of claim 8, wherein the lid is one of a polymer lid, a metal lid and a ceramic lid.

10. The device of claim 8, wherein the lid is glued, soldered, clamped, or bonded to the active area.

11. The device of claim 1, wherein the at least one interconnect is located on a back side of the at least one semiconductor chip.

12. The device of claim 11, wherein the at least one interconnect is electrically connected to the at least one contact area by at least one through-silicon-via.

13. The device of claim 12, wherein the low-k sub-area is mechanically decoupled from the back side of the at least one chip by at least one layer of silicon.

14. The device of claim 1, further comprising:
a substrate electrically connected to the at least one interconnect.

15. The device of claim 1, wherein the at least one interconnect is a flip-chip bump or a copper pillar.

16. A semiconductor device comprising:
at least one semiconductor chip, the chip comprising: an active area on a top side of the at least one semiconductor chip, the active area being formed at least in part of a low-k material defining a low-k sub-area of the active area;
an embedding material embedding the at least one semiconductor chip, wherein at least part of the embedding material forms a coplanar area with the active area;
at least one contact area disposed within the low-k sub-area;
a redistribution layer disposed on the coplanar area, wherein the redistribution layer is electrically connected to the at least one contact area;
at least one interconnect, located outside the low-k subarea, the interconnect electrically connected to the at least one contact area via the redistribution layer.

17. The device of claim 16, further comprising:
a dielectric layer disposed on the coplanar area.

18. The device of claim 16, further comprising:
a protection layer applied over the low-k sub-area.

19. The device of claim 18, wherein the protection layer is composed of one or more materials selected from the group consisting of: silicone, polyurethane, epoxy, polyimide.

20. The device of claim 18, wherein the protection layer contains silicone particles with one of the following fillers: air gaps, air foams, bubbles.

21. The device of claim 16, further comprising:
a lid disposed over the active area.

22. The device of claim 21, wherein the lid is one of a polymer lid, a metal lid and a ceramic lid.

23. The device of claim 21, wherein the lid is glued, soldered, clamped, or bonded to the active area.

24. The device of claim 16, further comprising:
a substrate electrically connected to the at least one interconnect.

25. The device of claim 16, wherein the at least one interconnect is a flip-chip bump or a copper pillar.

26. A method of producing a semiconductor device, comprising:
embedding a semiconductor chip, including a top side with an active area formed at least part of low-k material defining a low-k sub-area, into an embedding material;
forming a planar surface on the embedding material, the active area coplanar with the embedding material;
disposing at least one contact area within the low-k sub-area;
disposing a redistribution layer on the coplanar area, the redistribution layer electrically connected to the at least one contact area;
forming at least one interconnect outside the low-k sub-area, the at least one interconnect electrically connected to the at least one contact area within the low-k sub-area via the redistribution layer.

27. The method of claim 26, further comprising:
depositing a dielectric layer on the coplanar area.

28. The method of claim 26, further comprising:
depositing a protection layer over the low-k sub-area.

29. The method of claim 26, further comprising:
disposing a lid over the low-k sub-area.

30. The method of claim 26, further comprising:
connecting a substrate electrically with the at least one interconnect.

* * * * *